United States Patent
Yoo

(10) Patent No.: US 10,964,721 B2
(45) Date of Patent: *Mar. 30, 2021

(54) SEMICONDUCTOR DEVICES INCLUDING FERROELECTRIC LAYER AND METHODS OF FABRICATING THE SAME

(71) Applicant: SK hynix Inc., Icheon-si (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/909,865

(22) Filed: Jun. 23, 2020

(65) Prior Publication Data
US 2020/0321354 A1    Oct. 8, 2020

Related U.S. Application Data

(62) Division of application No. 15/975,712, filed on May 9, 2018, now Pat. No. 10,734,409.

(30) Foreign Application Priority Data

Jun. 8, 2017  (KR) .................. 10-2017-0071603

(51) Int. Cl.
| | |
|---|---|
| *H01L 27/11597* | (2017.01) |
| *G11C 11/22* | (2006.01) |
| *H01L 29/78* | (2006.01) |
| *H01L 29/51* | (2006.01) |
| *H01L 21/28* | (2006.01) |

(52) U.S. Cl.
CPC ...... *H01L 27/11597* (2013.01); *G11C 11/223* (2013.01); *G11C 11/2255* (2013.01); *G11C 11/2257* (2013.01); *H01L 29/40111* (2019.08); *H01L 29/516* (2013.01); *H01L 29/78391* (2014.09)

(58) Field of Classification Search
None
See application file for complete search history.

(56) References Cited

U.S. PATENT DOCUMENTS

| | | |
|---|---|---|
| 10,490,571 B2 | 11/2019 | Yoo et al. |
| 2009/0261395 A1 | 10/2009 | Boescke |
| 2016/0118404 A1 | 4/2016 | Peng |
| 2016/0181091 A1 | 6/2016 | Niyogi et al. |
| 2018/0090591 A1 | 3/2018 | Ando et al. |
| 2018/0130823 A1* | 5/2018 | Kim ............... H01L 29/6684 |
| 2018/0277191 A1* | 9/2018 | Yoo ............... H01L 29/78391 |
| 2019/0074295 A1 | 3/2019 | Schroder |
| 2019/0123061 A1* | 4/2019 | Liu ............... G11C 11/2273 |
| 2019/0148406 A1* | 5/2019 | Liu ............... H01L 29/40111 |
| | | 257/295 |
| 2019/0148540 A1 | 5/2019 | Wang et al. |

(Continued)

*Primary Examiner* — Alexander G Ghyka

(57) ABSTRACT

A semiconductor device includes a stack structure having a plurality of interlayer insulation layers and a plurality of gate electrode layers which are alternately stacked on a substrate, a ferroelectric insulation layer and a channel layer sequentially stacked on a sidewall of a trench that penetrates the stack structure, and a capping oxide pattern disposed between the ferroelectric insulation layer and each of the plurality of interlayer insulation layers. The capping oxide pattern and the ferroelectric insulation layer include the same metal oxide material.

8 Claims, 16 Drawing Sheets

(56) References Cited

U.S. PATENT DOCUMENTS

| | | |
|---|---|---|
| 2019/0296122 A1 | 9/2019 | Ino et al. |
| 2020/0066756 A1* | 2/2020 | Yoo .................. H01L 27/11504 |
| 2020/0119047 A1* | 4/2020 | Yoo .................. H01L 29/40111 |
| 2020/0212068 A1* | 7/2020 | Lee .................. H01L 29/41741 |
| 2020/0235244 A1* | 7/2020 | Doyle ................ H01L 29/7827 |

* cited by examiner

SEMICONDUCTOR DEVICES INCLUDING FERROELECTRIC LAYER AND METHODS OF FABRICATING THE SAME

CROSS-REFERENCE TO RELATED APPLICATIONS

The present application is a divisional application of a U.S. patent application Ser. No. 15/975,712, filed on May 9, 2018, which claims priority under 35 U.S.C 119(a) to Korean Application No. 10-2017-0071603, filed on Jun. 8, 2017, which is herein incorporated by references in its entirety.

BACKGROUND

1. Technical Field

The present disclosure generally relates to semiconductor devices, and more particularly, to semiconductor devices including a ferroelectric layer and methods of fabricating the same.

2. Related Art

Recently, semiconductor devices storing information such as data by varying an electrical resistance value of a thin material layer have been developed. These semiconductor devices may generate and store the information using a characteristic that the electrical resistance value of an internal memory element in the semiconductor devices varies according to a current or a voltage which is applied to the internal memory element. The information corresponding to the electrical resistance value of the internal memory element may be stored into the semiconductor device as a nonvolatile datum. That is, the semiconductor devices including the thin material layer having a variable resistive characteristic may be used as nonvolatile memory devices. These nonvolatile memory devices may include, for example, magnetic random access memory (MRAM) devices, phase change RAM (PCRAM) devices, resistive RAM (ReRAM) device, and ferroelectric RAM (FRAM) devices.

As semiconductor devices become more highly integrated with a reduced design rule, the semiconductor devices have been continuously developed to guarantee both their structural stability and operational reliability. In order to realize stable and reliable semiconductor devices, various three-dimensional memory cell structures have been proposed.

SUMMARY

According to an embodiment, there is provided a semiconductor device. The semiconductor device includes a stack structure having a plurality of interlayer insulation layers and a plurality of gate electrode layers which are alternately stacked on a substrate, a ferroelectric insulation layer and a channel layer sequentially stacked on a sidewall of a trench that penetrates the stack structure, and a capping oxide pattern disposed between the ferroelectric insulation layer and each of the plurality of interlayer insulation layers. The capping oxide pattern and the ferroelectric insulation layer include the same metal oxide material.

According to an embodiment, there is provided a method of fabricating a semiconductor device. The method includes forming a stack layer structure including a plurality of interlayer insulation layers and a plurality of interlayer sacrificial layers which are alternately stacked on a substrate, forming a trench that penetrates the stack layer structure on the substrate, forming a capping oxide layer on a sidewall of the trench, forming a ferroelectric insulation layer on the capping oxide layer and a channel layer on the ferroelectric insulation layer, selectively removing the plurality of interlayer sacrificial layers and portions of the capping oxide layer to form recesses that expose portions of the ferroelectric insulation layer, and filling the recesses with a conductive layer to form gate electrode layers in the recesses.

According to yet an embodiment, there is provided a method of fabricating a semiconductor device. The method includes forming a capping oxide layer on a substrate, sequentially forming a ferroelectric material having an amorphous phase and a channel layer on the capping oxide layer, annealing the ferroelectric material to form a ferroelectric insulation layer having a crystalline structure, and forming a gate electrode layer in contact with at least a portion of the ferroelectric insulation layer. The capping oxide layer has a lattice constant which is different from a lattice constant of the ferroelectric insulation layer, and an oxygen vacancy concentration of the capping oxide layer is higher than an oxygen vacancy concentration of the ferroelectric insulation layer.

DETAILED DESCRIPTION OF THE EMBODIMENTS

Figure 1:
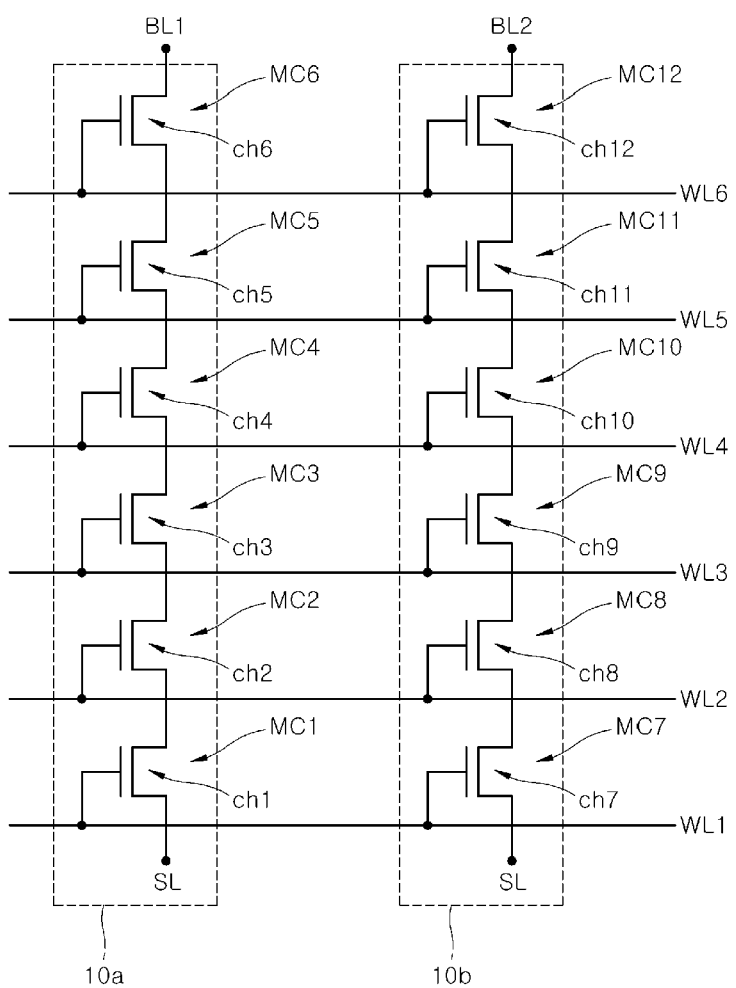
FIG. 1 is an equivalent circuit diagram illustrating a portion of a semiconductor device according to an embodiment of the present disclosure.

Various embodiments of the present disclosure will now be described more fully hereinafter with reference to the accompanying drawings. In the drawing figures, the dimensions (e.g., widths or thicknesses) of components (e.g., layers or regions) may be exaggerated for clarity of illustration. It will be understood that when an element is referred to as being "on" another element, it can be directly "on" the other element or intervening elements may also be present. In the drawings, like reference numerals refer to like elements throughout.

As used herein, the singular terms "a," "an" and "the" are intended to include the plural forms as well, unless the context clearly indicates otherwise. It will be understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof. Furthermore, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto. Moreover, two or more process steps sequentially performed in an embodiment may be simultaneously performed in another embodiment.

FIG. 1 is an equivalent circuit diagram schematically illustrating a portion, for example, a cell array region 10 of a semiconductor device according to an embodiment of the present disclosure. The cell array region 10 may include a plurality of memory cells, each of which includes a transistor-type cell that employs a ferroelectric insulation layer as a gate dielectric layer.

Referring to FIG. 1, the cell array region 10 may include a plurality of strings, for example, a first string 10a and a second string 10b. First ends of the first and second strings 10a and 10b may be connected to a common source line SL, and second ends of the first and second strings 10a and 10b may be respectively connected to a first bit line BL1 and a second bit line BL2. Although FIG. 1 illustrates an example in which the cell array region 10 includes the first and second strings 10a and 10b for the purpose of ease and convenience in explanation, the present disclosure is not limited thereto. That is, the number of the strings included in the cell array region 10 is not limited to two.

The first string 10a may include first to sixth memory cell transistors (MC1, MC2, MC3, MC4, MC5 and MC6) which are connected in series. The second string 10b may include seventh to twelfth memory cell transistors (MC7, MC8, MC9, MC10, MC11 and MC12) which are connected in series. Although FIG. 1 illustrates an example in which each of the first and second strings 10a and 10b includes six memory cell transistors for the purpose of ease and convenience in explanation, the present disclosure is not limited thereto. That is, the number of the memory cell transistors included in each string 10a or 10b is not limited to six, and may be less than six.

The first to sixth memory cell transistors (MC1, MC2, MC3, MC4, MC5 and MC6) included in the first string 10a may be connected to first to sixth word lines (WL1, WL2, WL3, WL4, WL5 and WL6), respectively. Similarly, the seventh to twelfth memory cell transistors (MC7, MC8, MC9, MC10, MC11 and MC12) included in the second string 10b may be connected to the first to sixth word lines (WL1, WL2, WL3, WL4, WL5 and WL6), respectively.

In an embodiment, each of the first to twelfth memory cell transistors (MC1, MC2, ... and MC12) may employ a ferroelectric insulation layer as a gate dielectric layer thereof. If a gate voltage higher than a threshold voltage (i.e., a coercive voltage) is applied to gate electrodes of the first to twelfth memory cell transistors (MC1, MC2, ... and MC12) through the first to sixth word lines (WL1, WL2, ... and WL6), electric dipoles in the ferroelectric insulation layers corresponding to the gate dielectric layers of the first to twelfth memory cell transistors (MC1, MC2, ... and MC12) may be polarized in a predetermined direction. Thereafter, even though the gate voltage is removed from the first to twelfth memory cell transistors (MC1, MC2, ... and MC12), the electric dipoles in the ferroelectric insulation layers may still maintain the polarized state. First to twelfth channel resistance values (ch1, ch2, ... and ch12) of the first to twelfth memory cell transistors (MC1, MC2, ... and MC12) may vary according to the polarized states of the ferroelectric insulation layers used as the gate dielectric layers. A channel resistance value (i.e., one of the first to twelfth channel resistance values (ch1, ch2, ... and ch12)) means an electrical resistance value of a channel layer between a source electrode and a drain electrode of the corresponding memory cell transistor. Since the ferroelectric insulation layers in the first to twelfth memory cell transistors (MC1, MC2, ... and MC12) are polarized if the relatively high gate voltage (i.e., higher than a threshold voltage) is applied to the gate electrodes of the first to twelfth memory cell transistors (MC1, MC2, ... and MC12), and since the ferroelectric insulation layers still maintain the polarized states even after the relatively high gate voltage is removed from the first to twelfth memory cell transistors (MC1, MC2, ... and MC12), the first to twelfth memory cell transistors (MC1, MC2, ... and MC12) may be used as nonvolatile memory cells. In such a case, the channel resistance values of the first to twelfth memory cell transistors (MC1, MC2, ... and MC12) may be determined according to the polarized states of the dipoles of the ferroelectric insulation layers.

According to a method of operating the semiconductor device including the cell array region 10, the relatively high gate voltages (i.e., program voltages) respectively applied to the first to sixth word lines (WL1, WL2, ... and WL6) may be independently controlled. Thus, the first to sixth channel resistance values (ch1, ch2, ... and ch6) of the first to sixth memory cell transistors (MC1, MC2, ... and MC6) constituting the first string 10a may be independently determined. A total channel resistance value of the first string 10a may correspond to a sum of the first to sixth channel resistance values (ch1, ch2, ... and ch6) of the first to sixth memory cell transistors (MC1, MC2, ... and MC6) which are connected in series. As a result, a plurality of data, at least two of which are different from each other, may be stored in the first string 10a by independently controlling the program voltages respectively applied to the gate electrodes of the first to sixth memory cell transistors (MC1, MC2, ... and MC6).

Similarly, a plurality of data, at least two of which are different from each other, may be stored in the second string 10b by independently controlling the program voltages respectively applied to the gate electrodes of the seventh to twelfth memory cell transistors (MC7, MC8, ... and MC12).

According to embodiments, the semiconductor device may be realized to have a three-dimensional structure including a plurality of memory cell transistors which are vertically stacked between a source line and a bit line, as described hereinafter.

Figure 2A:
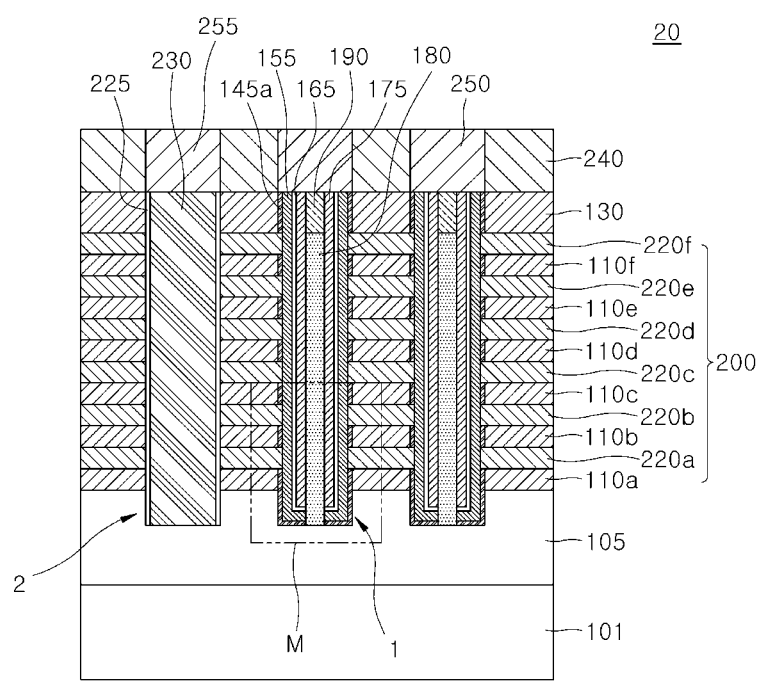
FIG. 2A is a cross-sectional view illustrating a portion of a semiconductor device according to an embodiment of the present disclosure.
Figure 2B:
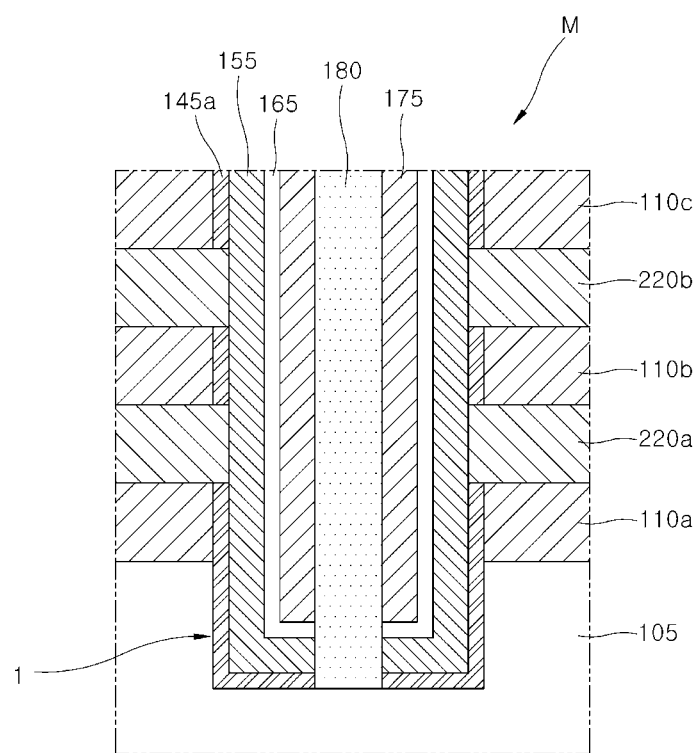
FIG. 2B is a partially enlarged view illustrating a portion 'M' of FIG. 2A.

FIG. 2A is a cross-sectional view illustrating a portion of a semiconductor device 20 according to an embodiment of the present disclosure, and FIG. 2B is a partially enlarged view illustrating a portion 'M' of FIG. 2A. The semiconductor device 20 according to an embodiment may include a plurality of transistor-type memory cells, each of which employs a ferroelectric insulation layer as a gate dielectric layer.

Referring to FIGS. 2A and 2B, the semiconductor device 20 may include a substrate 101, a base conductive layer 105 on a surface of the substrate 101, and a stack structure 200 on a surface of the base conductive layer 105 opposite to the surface interfacing with substrate 101.

In an embodiment, the substrate 101 may be a semiconductor substrate. The semiconductor substrate may be, for example, a silicon (Si) substrate, a gallium arsenide (GaAs) substrate, an indium phosphide (InP) substrate, a germanium (Ge) substrate or a silicon germanium (SiGe) substrate. The semiconductor substrate may be doped with N-type impurities or P-type impurities to have an N-type conductivity or a P-type conductivity. In another embodiment, the substrate

101 may be an insulation substrate such as a silicon-on-insulator (SOI) substrate. In yet another embodiment, the substrate 101 may be a conductive substrate such as a metallic substrate.

The base conductive layer 105 may be disposed on a surface of the substrate 101. The base conductive layer 105 may include a doped semiconductor material, a metal material, a conductive metal nitride material or a conductive metal silicide material. In an embodiment, the base conductive layer 105 may be a semiconductor layer including a silicon material doped with N-type impurities when the substrate 101 is a silicon-based semiconductor substrate. In another embodiment, the base conductive layer 105 may include a tungsten (W) material, a titanium (Ti) material, a copper (Cu) material, an aluminum (Al) material, a tungsten nitride (WN) material, a titanium nitride (TiN) material, a tantalum nitride (TaN) material, a tungsten silicide (WSi) material, a titanium silicide (TiSi) material, a tantalum silicide (TaSi) material or a combination material containing at least two of the above different materials.

Although not illustrated in the drawings, the substrate 101 may include an N-type well or a P-type well. Various integrated circuits may be disposed between the substrate 101 and the base conductive layer 105.

The stack structure 200 may be disposed on a surface of the base conductive layer 105 opposite to the surface interfacing with substrate 101. Alternatively, the stack structure 200 may be disposed on the substrate 101. The stack structure 200 may include interlayer insulation layers 110a, 110b, 110c, 110d, 110e and 110f and gate electrode layers 220a, 220b, 220c, 220d, 220e and 220f. The interlayer insulation layers and the gate electrode layers may be alternately stacked on the base conductive layer 105.

The interlayer insulation layers 110a, 110b, 110c, 110d, 110e and 110f may include, for example, a silicon oxide material, a silicon nitride material or a silicon oxynitride material. The gate electrode layers 220a, 220b, 220c, 220d, 220e and 220f may include a metal material, a conductive metal nitride material, a conductive metal carbide material, a conductive metal silicide material or a combination material containing at least two of the above different materials. For example, the electrode layers 220a, 220b, 220c, 220d, 220e and 220f may include a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material, a tantalum silicide (TaSi) material or a combination material containing at least two of the above different materials.

Referring again to FIGS. 2A and 2B, the semiconductor device 20 may include a first trench 1 that penetrates or extends through the stack structure 200 to reach the base conductive layer 105. In addition, the semiconductor device 20 may include a ferroelectric insulation layer 155, an interfacial insulation layer 165 and a channel layer 175 which are sequentially stacked on a sidewall of the first trench 1.

The ferroelectric insulation layer 155 may include a metal oxide material. The metal oxide material may include, for example, a hafnium oxide (HfO) material, a zirconium oxide (ZrO) material, a hafnium zirconium oxide (HfZrO) material or a combination containing at least two of the above different materials. The ferroelectric insulation layer 155 may include dopants. The dopants may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd) or a combination containing at least two of the above different elements. The ferroelectric insulation layer 155 may have a crystalline structure. For example, the ferroelectric insulation layer 155 may have a crystalline structure of the orthorhombic system. The ferroelectric insulation layer 155 may have a thickness of approximately five (5) nanometers to approximately ten (10) nanometers.

The interfacial insulation layer 165 may suppress carriers (e.g., electrons) drifting through the channel layer 175 from injecting or tunneling into the ferroelectric insulation layer 155 during a read operation of the semiconductor device 20. If the carriers (e.g., electrons) drifting through the channel layer 175 are injected into the ferroelectric insulation layer 155, the carriers (e.g., electrons) may be trapped by defect sites in the ferroelectric insulation layer 155 and act as sources of a leakage current flowing through the ferroelectric insulation layer 155 disposed between the channel layer 175 and the electrode layers 220a, 220b, 220c, 220d, 220e and 220f. In addition, the interfacial insulation layer 165 may act as a diffusion barrier layer for suppressing diffusion of material atoms between the channel layer 175 and the ferroelectric insulation layer 155 while the semiconductor device 20 is fabricated. The interfacial insulation layer 165 may include, for example, a silicon oxide material or an aluminum oxide material. The interfacial insulation layer 165 may have an amorphous phase. Meanwhile, in some other embodiments, the interfacial insulation layer 165 may be absent if the ferroelectric insulation layer 155 has a low defect density and maintains a stable interface state when the ferroelectric insulation layer 155 is disposed on the channel layer 175.

The channel layer 175 may include a semiconductor material. For example, the channel layer 175 may be an N-type silicon layer or an intrinsic silicon layer. The channel layer 175 may be electrically connected to the base conductive layer 105 disposed under the stack structure 200 and may also be electrically connected to a channel contact pattern 190 located above the stack structure 200. A bit line connection pattern 250 may be disposed on the channel contact pattern 190. The bit line connection pattern 250 may electrically connect the channel contact pattern 190 to a bit line.

A filling material pattern 180 may be disposed to interface with the channel layer 175 and fill the first trench 1. The filling material pattern 180 may include an oxide material, a nitride material or an oxynitride material.

According to an embodiment, the semiconductor device 20 may include a capping oxide pattern 145a disposed between the ferroelectric insulation layer 155 and each interlayer insulation layer 110a, 110b, 110c, 110d, 110e or 110f. The capping oxide pattern 145a may not be disposed between the ferroelectric insulation layer 155 and each gate electrode layer 220a, 220b, 220c, 220d, 220e or 220f.

Figure 11:
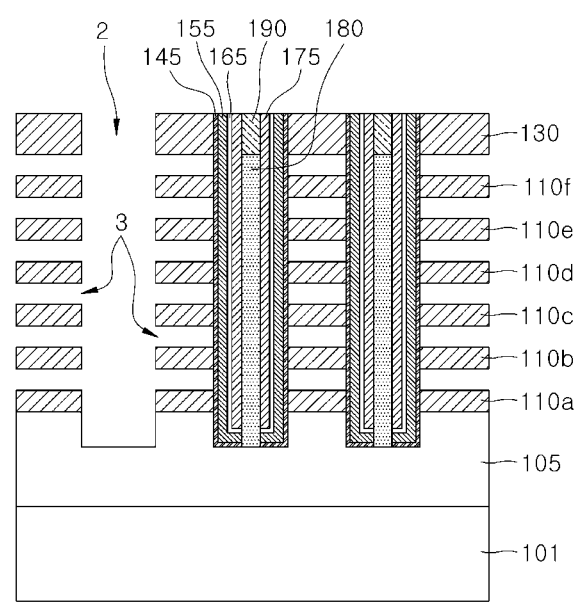
Figure 12:
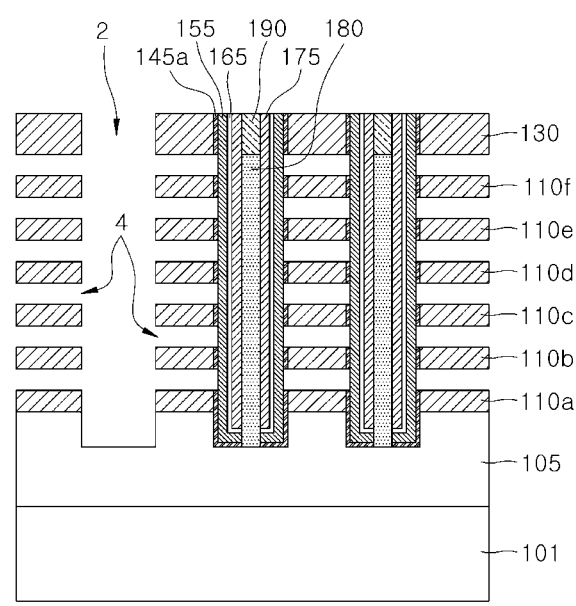

In a method of fabricating the semiconductor device 20 described with reference to FIG. 7, the capping oxide layer 145 is disposed in trench 1. The capping oxide layer 145 is used in connection with crystallizing a ferroelectric material on the capping oxide layer 145 with an annealing process. The crystallization annealing process may be performed when the ferroelectric material is in contact with the capping oxide layer 145. Subsequently, portions of the capping oxide layer 145 exposed between the interlayer insulation layers 110a, 110b, 110c, 110d, 110e or 110f may be removed to form the capping oxide patterns 145a as illustrated in FIG. 11 and FIG. 12.

The capping oxide patterns 145a may include a metal oxide material. The capping oxide patterns 145a may include the same or substantially the same metal oxide material as the ferroelectric insulation layer 155. For example, the metal oxide material of the capping oxide patterns 145a may include a hafnium oxide material, a zirconium oxide material, a hafnium zirconium oxide material or a combination containing at least two of the above different materials.

In an embodiment, the capping oxide patterns 145a may include a metal oxide material and dopants distributed in the metal oxide material. In such a case, the dopants may include silicon (Si), aluminum (Al), yttrium (Y), lanthanum (La), zirconium (Zr) or a combination containing at least two of the above different elements. The dopants may be distributed in the capping oxide patterns 145a to have a content of approximately three (3) by atomic percent (at %) to approximately ten (10) at %. The dopants may exist in the metal oxide material in a solid solution form or may combine with the metal oxide material to exist in a metal compound form.

In an embodiment, the capping oxide patterns 145a may be a hafnium oxide material doped with silicon atoms having a content of approximately five (5) at %. In such a case, the silicon atoms may react with the hafnium oxide material to exist in a hafnium silicon oxide material state. For example, the capping oxide patterns 145a may be comprised of hafnium silicon oxide ($Hf_{0.5}Si_{0.5}O_2$) unit cells and non-doped hafnium oxide ($HfO_2$) unit cells. In such a case, the hafnium silicon oxide ($Hf_{0.5}Si_{0.5}O_2$) unit cells and the non-doped hafnium oxide ($HfO_2$) unit cells may be distributed in a ratio of 1:10.

In an embodiment, a lattice constant of the capping oxide patterns 145a may be different from a lattice constant of the ferroelectric insulation layer 155. The lattice constant difference between the ferroelectric insulation layer 155 and the capping oxide patterns 145a may be due to the strain of the lattice structure of the metal oxide material including dopants distributed in the capping oxide patterns 145a. In an embodiment, an oxygen vacancy concentration of the capping oxide patterns 145a may be higher than an oxygen vacancy concentration of the ferroelectric insulation layer 155. This may be due to defects caused by the dopants (e.g., silicon atoms) injected into the capping oxide patterns 145a. Each of the oxygen vacancies distributed in the ferroelectric insulation layer 155 and the capping oxide patterns 145a may have an electric charge. Thus, an electric field may be created across an interface between the ferroelectric insulation layer 155 and each capping oxide pattern 145a due to a difference between the oxygen vacancy concentration of the ferroelectric insulation layer 155 and the oxygen vacancy concentration of the capping oxide patterns 145a. The electric field across the interface between the ferroelectric insulation layer 155 and each capping oxide pattern 145a may induce atoms in the ferroelectric insulation layer 155 to be arrayed to have a ferroelectric lattice structure while a crystallization annealing process is applied to the ferroelectric insulation layer 155.

The capping oxide patterns 145a may have a para-electric property or an anti-ferroelectric property. Each of the capping oxide patterns 145a may have a thickness which is less than a thickness of the ferroelectric insulation layer 155. For example, each of the capping oxide patterns 145a may have a thickness of approximately one (1) nanometer to approximately five (5) nanometers. The capping oxide patterns 145a may have a cubic crystalline structure or a tetragonal crystalline structure, as non-limiting examples.

Referring again to FIG. 2A, the semiconductor device 20 may include a second trench 2 that penetrates the stack structure 200 to reach the base conductive layer 105. The semiconductor device 20 may further include a spacer insulation layer 225 disposed on a sidewall of the second trench 2 and a first source line connection pattern 230 disposed to interface with the spacer insulation layer 225 to fill the second trench 2. The first source line connection pattern 230 may be electrically connected to the base conductive layer 105 located under the second trench 2. In addition, the first source line connection pattern 230 may be electrically connected to a second source line connection pattern 255 disposed on the first source line connection pattern 230. The second source line connection pattern 255 may electrically connect the first source line connection pattern 230 to a source line (not shown). The first and second source line connection pattern 230 and 255 are electrically connected to one end of the channel layer 175 through the base conductive layer 105, and the bit line connection pattern 250 is electrically connected to the other end of the channel layer 175 through the channel contact pattern 190.

The second source line connection pattern 255 may be electrically insulated from the bit line connection pattern 250 in a lateral direction on the stack structure 200 by a second upper insulation layer 240.

The semiconductor device 20 may be configured to include substantially the same strings as the first and second strings 10a and 10b illustrated in FIG. 1. Each of the strings may include a plurality of memory cell transistors which are vertically stacked and arrayed on the base conductive layer 105.

For example, the plurality of memory cell transistors may include the gate electrode layers 220a, 220b, 220c, 220d, 220e and 220f such as illustrated in FIG. 2A. The gate electrode layers 220a, 220b, 220c, 220d, 220e and 220f may be connected to different word lines (not shown), respectively. Accordingly, the polarization states in portions of the ferroelectric insulation layer 155, which are respectively adjacent to the gate electrode layers 220a, 220b, 220c, 220d, 220e and 220f, may be independently controlled by voltages respectively applied to the different word lines. Thus, channel resistance values of the plurality of memory cell transistors sharing the channel layer 175 with each other may be independently controlled.

Consequently, data may be independently stored into the plurality of memory cell transistors constituting each of the strings.

Figure 3:
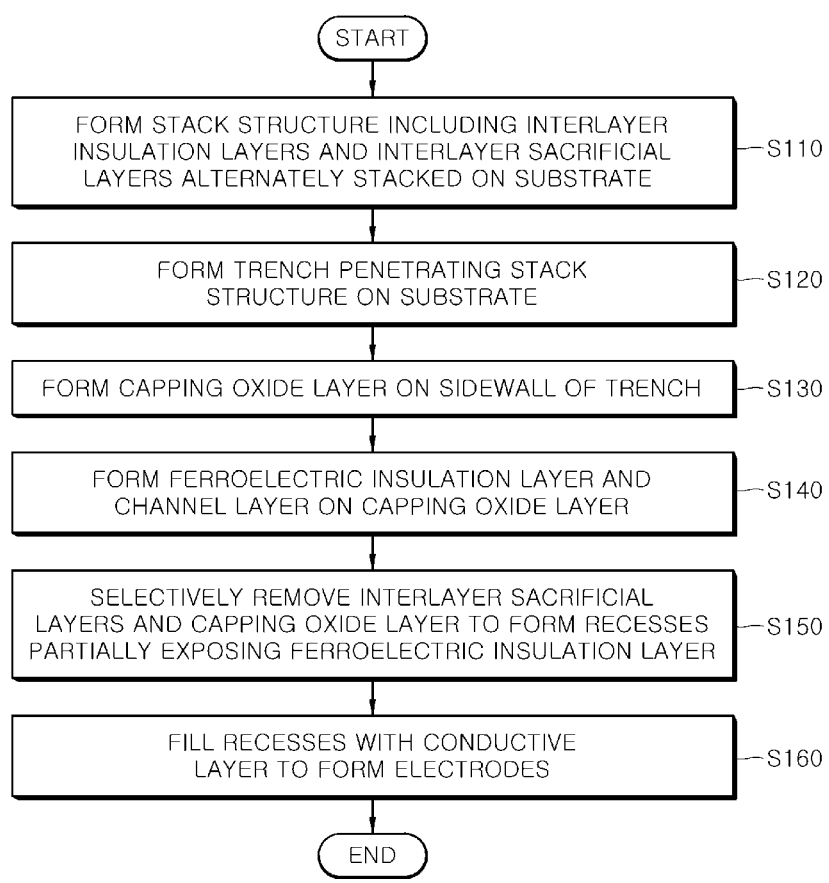
FIG. 3 is a flowchart illustrating a method of fabricating a semiconductor device according to an embodiment of the present disclosure.

FIG. 3 is a flowchart illustrating a method of fabricating a semiconductor device according to an embodiment of the present disclosure. Referring to FIG. 3, a stack structure may be formed on a substrate (see step S110). The stack structure may be formed by alternately stacking interlayer insulation layers and interlayer sacrificial layers. The interlayer sacrificial layers may be formed of a material layer having an etch selectivity with respect to the interlayer insulation layers.

A trench penetrating the stack structure may be formed on the substrate (see step S120). Accordingly, the interlayer insulation layers and the interlayer sacrificial layers may be exposed at a sidewall of the trench.

A capping oxide layer may be formed on the sidewall of the trench (see step S130). The capping oxide layer may have a para-electric property or an anti-ferroelectric property. The capping oxide layer may be formed to include a metal oxide material. For example, the capping oxide layer may be formed to include a magnesium oxide material, a calcium oxide material, a strontium oxide material, a barium oxide material, an aluminum oxide material, a gallium oxide material, an yttrium oxide material, a scandium oxide material, a tantalum oxide material, a zirconium oxide material, a hafnium zirconium oxide material, a titanium oxide material, a lanthanum oxide material, a gadolinium oxide material, a zirconium silicon oxide material, a hafnium silicon oxide material, a titanium silicon oxide material or a combination material containing at least two of the above different materials. The capping oxide layer may be doped with dopants. The dopants in the capping oxide layer may include silicon (Si) atoms, aluminum (Al) atoms, yttrium (Y) atoms, lanthanum (La) atoms, zirconium (Zr) atoms or a combination containing at least two of the above different atoms. The dopants may cause oxygen vacancies to form in the capping oxide layer.

The capping oxide layer may be formed using an atomic layer deposition (ALD) process, a chemical vapor deposition (CVD) process or the like. The capping oxide layer may be formed using an in-situ doping technique. That is, the dopants may be injected into the capping oxide layer together with a metal source and an oxygen source while the capping oxide layer is formed. Alternatively, the dopants may be injected into the capping oxide layer using a diffusion technique or an ion implantation technique after the capping oxide layer is formed. The capping oxide layer may be formed to have an amorphous structure.

A ferroelectric insulation layer and a channel layer may be formed on the capping oxide layer (see step S140). In an embodiment, the ferroelectric insulation layer is formed on the capping oxide layer and the channel layer is formed on the ferroelectric insulation layer. The ferroelectric insulation layer may be formed to include a metal oxide material. For example, the ferroelectric insulation layer may be formed to include a hafnium oxide material, a zirconium oxide material, a hafnium zirconium oxide material or a combination material containing at least two of the above materials. In an embodiment, the ferroelectric insulation layer may be formed to include dopants. The dopants in the ferroelectric insulation layer may include, for example, carbon (C) atoms, silicon (Si) atoms, magnesium (Mg) atoms, aluminum (Al) atoms, yttrium (Y) atoms, nitrogen (N) atoms, germanium (Ge) atoms, tin (Sn) atoms, strontium (Sr) atoms, lead (Pb) atoms, calcium (Ca) atoms, barium (Ba) atoms, titanium (Ti) atoms, zirconium (Zr) atoms, gadolinium (Gd) atoms or a combination containing at least two of the above different atoms.

In an embodiment, the ferroelectric insulation layer may include oxygen vacancies. The oxygen vacancies may exist in a metal oxide material employed as or used in the ferroelectric insulation layer. In such a case, an oxygen vacancy concentration of the ferroelectric insulation layer may be lower than an oxygen vacancy concentration of the capping oxide layer.

The channel layer may be formed to include a semiconductor material. For example, the channel layer may be formed to include an N-type silicon material or an intrinsic silicon material.

In an embodiment, the step S140 of forming the ferroelectric insulation layer and the channel layer may include sequentially depositing a ferroelectric material and a semiconductor material on the capping oxide layer having an amorphous structure, and annealing the ferroelectric material using the capping oxide layer as a capping layer to form the ferroelectric insulation layer having a crystalline structure. While the ferroelectric material is annealed to form the ferroelectric insulation layer having a crystalline structure, the capping oxide layer may also be crystallized. The semiconductor material formed or deposited on the ferroelectric insulation layer may be used as the channel layer.

The ferroelectric insulation layer may have an orthorhombic crystalline structure. A lattice constant of the ferroelectric insulation layer may be different from a lattice constant of the capping oxide layer. The capping oxide layer may have a cubic crystalline structure or a tetragonal crystalline structure, after the ferroelectric insulation material is annealed to form the ferroelectric insulation layer. The capping oxide layer may have a para-electric property or an anti-ferroelectric property.

In some embodiments, an interfacial insulation layer may be additionally formed on the ferroelectric insulation material having an amorphous structure before the semiconductor material used as the channel layer is deposited. The interfacial insulation layer may be formed to include a silicon oxide material or an aluminum oxide material. Subsequently, the semiconductor material may be deposited on the interfacial insulation layer, and the crystallization annealing process may be performed as described above.

Although embodiments described herein are not limited to any one specific theory, it is possible that the ferroelectric insulation layer may exhibit an improved ferroelectric property after the crystallization annealing process if a predetermined or specific capping layer contacting the ferroelectric insulation layer is present.

In an example, if the capping oxide layer has a lattice constant which is different from a lattice constant of the ferroelectric insulation layer, the capping oxide layer may cause tensile strain or compressive strain in the ferroelectric insulation layer during the crystallization annealing process. In such a case, the tensile strain or the compressive strain in the ferroelectric insulation layer may improve the ferroelectric property of the ferroelectric insulation layer having a crystalline structure. Accordingly, the ferroelectric property of the ferroelectric insulation layer may be effectively improved after the crystallization annealing process.

In another theoretical example, if an oxygen vacancy concentration of the capping oxide layer is higher than an oxygen vacancy concentration of the ferroelectric insulation layer, an electric field may be created across an interface between the ferroelectric insulation layer and the capping oxide layer due to a difference between the oxygen vacancy concentration of the ferroelectric insulation layer and the oxygen vacancy concentration of the capping oxide layer. This is because each of the oxygen vacancies has a positive electric charge. Thus, the electric field may be created across an interface between the ferroelectric insulation layer and the capping oxide layer due to an electric potential difference between the ferroelectric insulation layer and the capping oxide layer. The electric field across the interface between the ferroelectric insulation layer and the capping oxide layer may induce atoms in the ferroelectric insulation layer to be arrayed to have a ferroelectric lattice structure during the crystallization annealing process. Accordingly, the crystallized ferroelectric insulation layer may exhibit a relatively strong ferroelectric property.

While the ferroelectric insulation material is annealed, the capping oxide layer may also be crystallized. The capping oxide layer may have a cubic crystalline structure or a tetragonal crystalline structure after the crystallization annealing process.

The interlayer sacrificial layers and portions of the capping oxide layer may be selectively removed to form recesses that expose portions of the ferroelectric insulation layer (see step S150).

In an embodiment, the step S150 of forming the recesses may include selectively removing the interlayer sacrificial layers with a wet etch process to expose portions of the capping oxide layer, as well as selectively etching the exposed portions of the capping oxide layer with a wet etch process to expose portions of the ferroelectric insulation layer. After the exposed portions of the capping oxide layer are etched, capping oxide patterns corresponding to unetched portions of the capping oxide layer may remain between the ferroelectric insulation layers and the interlayer insulation layers.

A conductive layer, for example, a gate electrode layer may be formed to fill the remaining recesses, and the conductive layer may be patterned to form gate electrodes in the recesses (see step S160). The gate electrode layer may be formed to include a metal material, a metal nitride material, a metal carbide material, a metal silicide material or a combination containing at least two of the above different materials. The gate electrode layer may interface with the ferroelectric insulation layer.

A semiconductor device fabricated according to the above process steps may correspond to a nonvolatile memory device including a plurality of memory cell transistors which are vertically stacked on a substrate.

Figure 4:
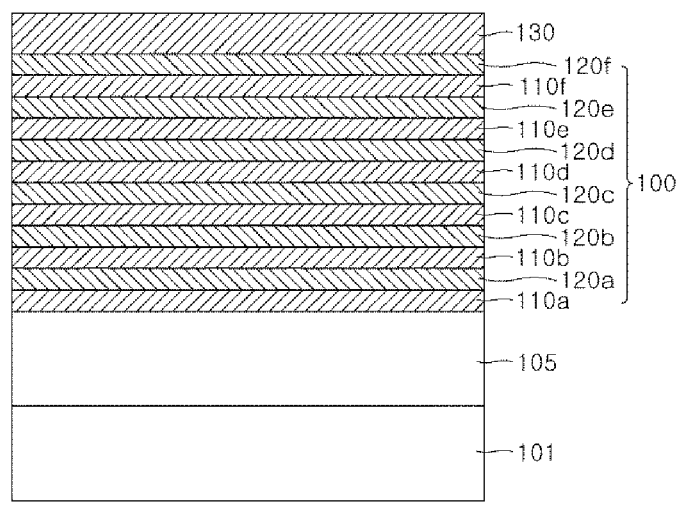
FIGS. 4 to 15 are cross-sectional views illustrating a method of fabricating a semiconductor device according to an embodiment of the present disclosure.

FIGS. 4 to 15 are cross-sectional views illustrating a method of fabricating a semiconductor device according to an embodiment of the present disclosure. Referring to FIG. 4, a substrate 101 may be provided. In an embodiment, the substrate 101 may be a semiconductor substrate. For example, the substrate 101 may be a silicon (Si) substrate, a gallium arsenide (GaAs) substrate, an indium phosphide (InP) substrate, a germanium (Ge) substrate or a silicon germanium (SiGe) substrate. If the substrate 101 is a semiconductor substrate, the semiconductor substrate may be a doped semiconductor substrate having a P-type conductivity or an N-type conductivity. In another embodiment, the substrate 101 may be an insulation substrate such as a silicon-on-insulator (SOI) substrate. In yet another embodiment, the substrate 101 may be a conductive substrate such as a metal substrate.

A base conductive layer 105 may be formed on the substrate 101. The base conductive layer 105 may be formed to include a doped semiconductor layer, a metal layer, a conductive metal nitride layer or a conductive metal silicide layer. In an embodiment, if the substrate 101 is a silicon (Si) substrate, the base conductive layer 105 may be formed to include an N-type silicon layer. The base conductive layer 105 may be formed using a CVD process, an ALD process or a sputtering process.

Although not shown in the drawings, the substrate 101 may include an N-type well or a P-type well. Various integrated circuits may be disposed between the substrate 101 and the base conductive layer 105.

A stack layer structure 100 may be formed on the base conductive layer 105. The stack layer structure 100 may be formed by alternately stacking interlayer insulation layers 110*a*, 110*b*, 110*c*, 110*d*, 110*e* and 110*f* and interlayer sacrificial layers 120*a*, 120*b*, 120*c*, 120*d*, 120*e* and 120*f*. The interlayer insulation layers 110*a*, 110*b*, 110*c*, 110*d*, 110*e* and 110*f* may be formed of a material having an etch selectivity with respect to the interlayer sacrificial layers 120*a*, 120*b*, 120*c*, 120*d*, 120*e* and 120*f*. For example, the interlayer insulation layers 110*a*, 110*b*, 110*c*, 110*d*, 110*e* and 110*f* may be formed of an oxide material, and the interlayer sacrificial layers 120*a*, 120*b*, 120*c*, 120*d*, 120*e* and 120*f* may be formed of a nitride material. In an alternative example, the interlayer insulation layers 110*a*, 110*b*, 110*c*, 110*d*, 110*e* and 110*f* may be formed of a nitride material, and the interlayer sacrificial layers 120*a*, 120*b*, 120*c*, 120*d*, 120*e* and 120*f* may be formed of an oxide material.

In an embodiment, the interlayer insulation layer 110*a* may be formed on the base conductive layer 105 as a bottommost layer or base layer of the stack layer structure 100. In such a case, the interlayer sacrificial layers 120*a*, 120*b*, 120*c*, 120*d*, 120*e* and 120*f* and the interlayer insulation layers 110*b*, 110*c*, 110*d*, 110*e* and 110*f* may be alternately stacked on the interlayer insulation layer 110*a*.

Although FIG. 4 illustrates an example with six interlayer insulation layers 110*a*, 110*b*, 110*c*, 110*d*, 110*e* and 110*f* and six interlayer sacrificial layers 120*a*, 120*b*, 120*c*, 120*d*, 120*e* and 120*f*, the present disclosure is not limited thereto. That is, the number of the interlayer insulation layers and the number of the interlayer sacrificial layers may be differ in different embodiments.

A first upper insulation layer 130 may be formed on the stack layer structure 100, for example, on the interlayer sacrificial layer 120*f* corresponding to the top layer of the stack layer structure 100. The first upper insulation layer 130 may be formed of a material having an etch selectivity with respect to the interlayer sacrificial layers 120*a*, 120*b*, 120*c*, 120*d*, 120*e* and 120*f*. For example, the first upper insulation layer 130 may be formed of the same material layer as the interlayer insulation layers 110*a*, 110*b*, 110*c*, 110*d*, 110*e* and 110*f*. The first upper insulation layer 130 may be formed to have a thickness which is greater than a thickness of each of the interlayer insulation layers 110*a*, 110*b*, 110*c*, 110*d*, 110*e* and 110*f*.

The interlayer insulation layers 110*a*, 110*b*, 110*c*, 110*d*, 110*e* and 110*f*, the interlayer sacrificial layers 120*a*, 120*b*, 120*c*, 120*d*, 120*e* and 120*f*, and the first upper insulation layer 130 may be formed using a CVD technique, an ALD technique or a coating technique.

Figure 5:
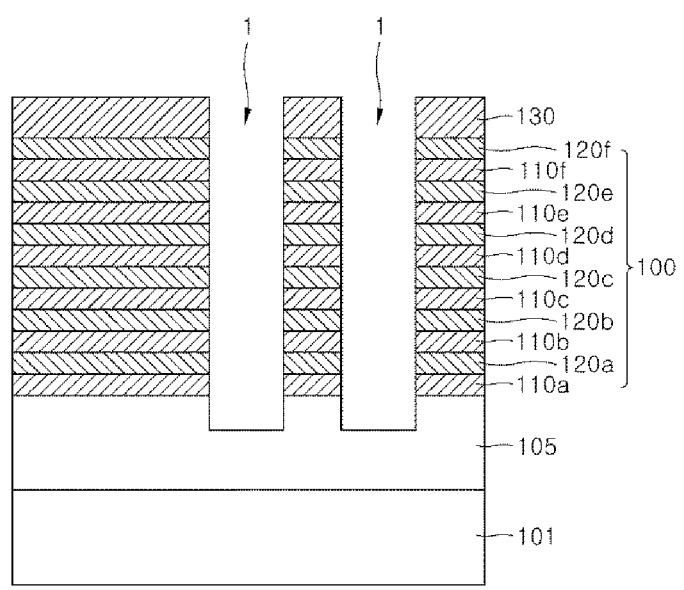

Referring to FIG. 5, first trenches 1 penetrating the first upper insulation layer 130 and the stack layer structure 100 may be formed to expose portions of the base conductive layer 105 formed on the substrate 101. In an embodiment, the first trenches 1 may be formed by anisotropically etching the first upper insulation layer 130 and the stack layer structure 100. For example, the first upper insulation layer 130 and the stack layer structure 100 may be anisotropically etched with a dry etching technique using plasma to form the first trenches 1. As illustrated in FIG. 5, the first upper insulation layer 130, the interlayer insulation layers 110*a*, 110*b*, 110*c*, 110*d*, 110*e* and 110*f*, and the interlayer sacrificial layers 120*a*, 120*b*, 120*c*, 120*d*, 120*e* and 120*f* may be exposed at a sidewall of each of the first trenches 1.

Figure 6:
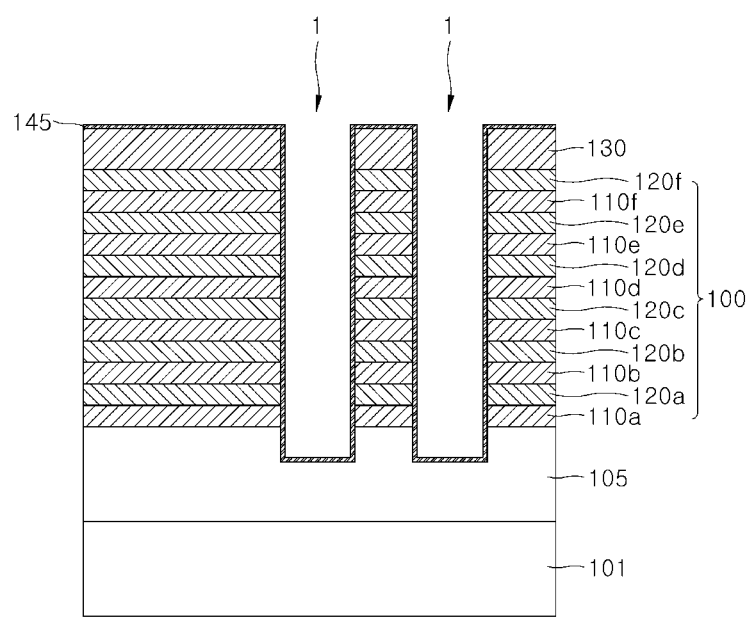

Referring to FIG. 6, a capping oxide layer 145 may be formed on inner surfaces of the first trenches 1 and on a top surface of the first upper insulation layer 130. In an embodiment, the capping oxide layer 145 may be formed to include a metal oxide layer having an amorphous structure. The capping oxide layer 145 may be formed to include a metal oxide material such as a magnesium oxide material, a calcium oxide material, a strontium oxide material, a barium oxide material, an aluminum oxide material, a gallium oxide material, an yttrium oxide material, a scandium oxide material, a tantalum oxide material, a zirconium oxide material, a hafnium zirconium oxide material, a titanium oxide material, a lanthanum oxide material, a gadolinium oxide material, a zirconium silicon oxide material, a hafnium silicon oxide material, a titanium silicon oxide material or a combination material containing at least two of the above different materials.

The metal oxide material used as the capping oxide layer 145 may include dopants. The dopants in the capping oxide layer 145 may include silicon (Si) atoms, aluminum (Al) atoms, yttrium (Y) atoms, lanthanum (La) atoms, zirconium (Zr) atoms or a combination containing at least two of the above different atoms. The dopants may be injected into the capping oxide layer 145 to have a content of approximately three (3) at % to approximately ten (10) at %. The dopants may exist in the capping oxide layer 145 in a solid solution form or may combine with the metal oxide material in the capping oxide layer 145 to exist in a metal compound form.

In an embodiment, the capping oxide layer 145 may be a hafnium oxide layer doped with silicon atoms having a content of approximately five (5) at %. In such a case, the silicon atoms may combine with the hafnium oxide layer to provide a hafnium silicon oxide material in the capping oxide layer 145. For example, the capping oxide layer 145 may be comprised of hafnium silicon oxide ($Hf_{0.5}Si_{0.5}O_2$) unit cells and non-doped hafnium oxide ($HfO_2$) unit cells. In such a case, the hafnium silicon oxide ($Hf_{0.5}Si_{0.5}O_2$) unit cells and the non-doped hafnium oxide ($HfO_2$) unit cells may be distributed in a ratio of 1:10.

The capping oxide layer 145 may be formed using an atomic layer deposition (ALD) process, a chemical vapor deposition (CVD) process or the like. The capping oxide layer 145 may be formed using an in-situ doping technique. That is, the dopants may be injected into the capping oxide layer 145 together with a metal source and an oxygen source while the capping oxide layer 145 is formed. Alternatively, the dopants may be injected into the capping oxide layer 145 using a diffusion technique or an ion implantation technique after the capping oxide layer 145 is formed. The capping oxide layer 145 may be formed to have an amorphous structure. The capping oxide layer 145 may be formed to have a thickness of approximately one (1) nanometer to approximately five (5) nanometers.

Figure 7:
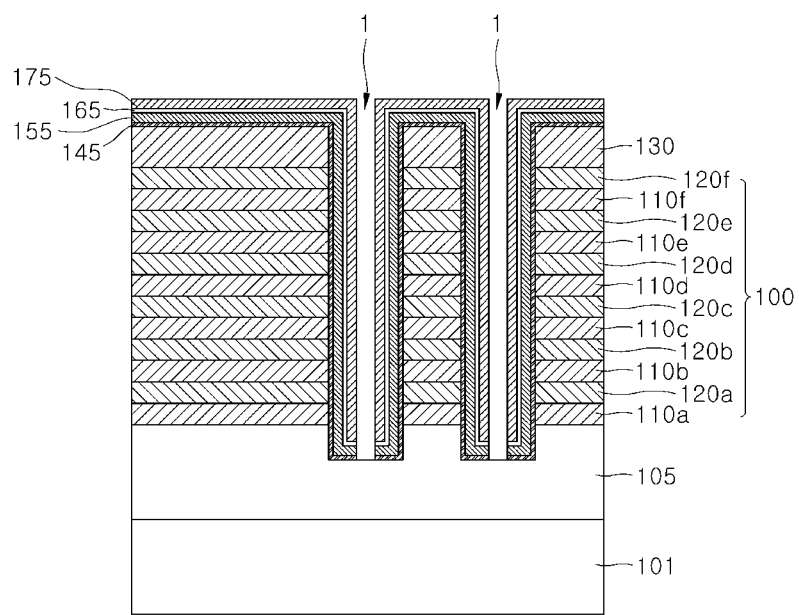

Referring to FIG. 7, a ferroelectric insulation layer 155, an interfacial insulation layer 165 and a channel layer 175 may be sequentially formed on the capping oxide layer 145. A method of forming the ferroelectric insulation layer 155, the interfacial insulation layer 165 and the channel layer 175 will be described in detail hereinafter. First, a ferroelectric material having an amorphous phase may be deposited on the capping oxide layer 145. Subsequently, an insulation material corresponding to the interfacial insulation layer 165 may be formed on the ferroelectric material. The insulation material corresponding to the interfacial insulation layer 165 may be formed to include a silicon oxide material or an aluminum oxide material. A semiconductor material corresponding to the channel layer 175 may then be deposited on the insulation material. Next, the stack layer structure 100 may be annealed using an oxygen gas or an inert gas as an ambient gas to crystalize the ferroelectric material. As a result of the crystallization annealing process, the ferroelectric insulation layer 155 having a ferroelectric property may be formed from the crystalized ferroelectric material. During the crystallization annealing process, the capping oxide layer 145 having an amorphous phase may also be crystallized.

The ferroelectric material, the insulation material and the semiconductor material may each be formed using an ALD technique or a CVD technique. The annealing process for crystallizing the ferroelectric material may be performed at a temperature of approximately 400 degrees Celsius to approximately 1000 degrees Celsius.

The ferroelectric material corresponding to the ferroelectric insulation layer 155 may be formed to include a hafnium oxide material, a zirconium oxide material, a hafnium zirconium oxide material or a combination containing at least two of the above different materials. In an embodiment, the ferroelectric material may include dopants. The dopants in the ferroelectric material may include, for example, carbon (C) atoms, silicon (Si) atoms, magnesium (Mg) atoms, aluminum (Al) atoms, yttrium (Y) atoms, nitrogen (N) atoms, germanium (Ge) atoms, tin (Sn) atoms, strontium (Sr) atoms, lead (Pb) atoms, calcium (Ca) atoms, barium (Ba) atoms, titanium (Ti) atoms, zirconium (Zr) atoms, gadolinium (Gd) atoms or a combination containing at least two of the above different atoms. The insulation material corresponding to the interfacial insulation layer 165 may be formed to include a silicon oxide material or an aluminum oxide material. The semiconductor material corresponding to the channel layer 175 may include an N-type silicon material or an intrinsic silicon material.

Meanwhile, the capping oxide layer 145 may act as a capping layer while the ferroelectric material having an amorphous phase is annealed. In such a case, a lattice constant of the capping oxide layer 145 may be different from a lattice constant of the ferroelectric insulation layer 155.

An oxygen vacancy concentration of the capping oxide layer 145 may be higher than an oxygen vacancy concentration of the ferroelectric insulation layer 155. This may be because a dopant concentration of the capping oxide layer 145 is higher than a dopant concentration of the ferroelectric insulation layer 155 or because one of the ferroelectric insulation layer 155 and the capping oxide layer 145 includes dopants, while the other layer is not doped. The dopants injected into the capping oxide layer 145 or the ferroelectric insulation layer 155 may generate the oxygen vacancies. In an embodiment, the capping oxide layer 145 may be formed of a hafnium oxide layer doped with dopants such as silicon (Si) atoms, and the ferroelectric insulation layer 155 may be formed of a non-doped hafnium oxide layer. The silicon (Si) atoms used as the dopants may be distributed in the capping oxide layer 145 to have a content of approximately three (3) at % to approximately ten (10) at %.

In addition, if a capping layer covering the ferroelectric material is present, the ferroelectric insulation layer 155 obtained by annealing the ferroelectric material having an amorphous phase may exhibit an improved ferroelectric property after the ferroelectric material is annealed. The ferroelectric insulation layer 155 obtained by annealing the ferroelectric material may have an orthorhombic crystalline structure. The ferroelectric insulation layer 155 may be formed to have a thickness of approximately five (5) nanometers to approximately ten (10) nanometers. In the meantime, the capping oxide layer 145 may have a cubic crystalline structure or a tetragonal crystalline structure after the ferroelectric material is annealed to form the ferroelectric insulation layer 155. The capping oxide layer 145 may have a para-electric property or an anti-ferroelectric property.

Figure 8:
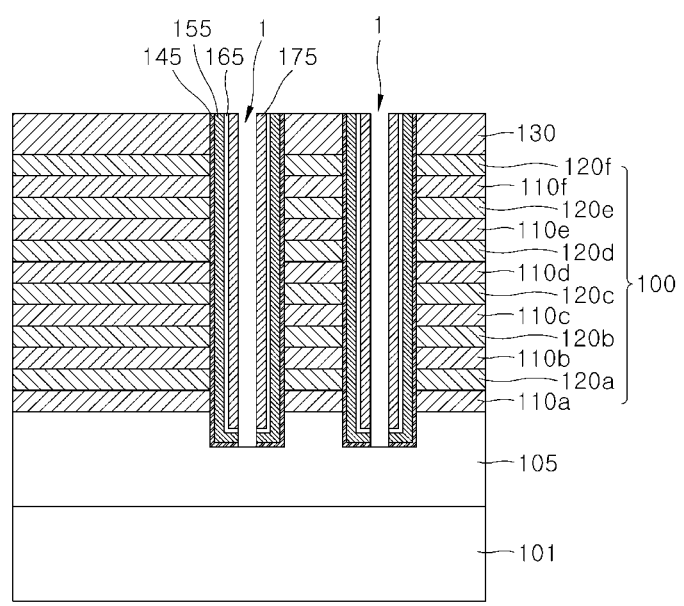

Referring to FIG. 8, the capping oxide layer 145, the ferroelectric insulation layer 155, the interfacial insulation layer 165 and the channel layer 175 stacked on the inner surface of the first trenches 1 and a surface of the first upper insulation layer 130 may be anisotropically etched to selectively remove the portions of the capping oxide layer 145, the ferroelectric insulation layer 155, the interfacial insulation layer 165 and the channel layer 175 which are disposed on a top surface of the first upper insulation layer 130 and on bottom surfaces of the first trenches 1. In an embodiment, the anisotropic etch process applied to the capping oxide layer 145, the ferroelectric insulation layer 155, the interfacial insulation layer 165 and the channel layer 175 may be performed using a dry etch technique with plasma. Alternatively, the anisotropic etch process applied to the capping oxide layer 145, the ferroelectric insulation layer 155, the interfacial insulation layer 165 and the channel layer 175 may be performed using an etch-back technique.

As a result of the anisotropic etch process, a portion of the base conductive layer 105 may be exposed at a bottom surface of each of the first trenches 1, and the capping oxide layer 145, the ferroelectric insulation layer 155, the interfacial insulation layer 165 and the channel layer 175 may remain on a sidewall of each of the first trenches 1.

Figure 9:
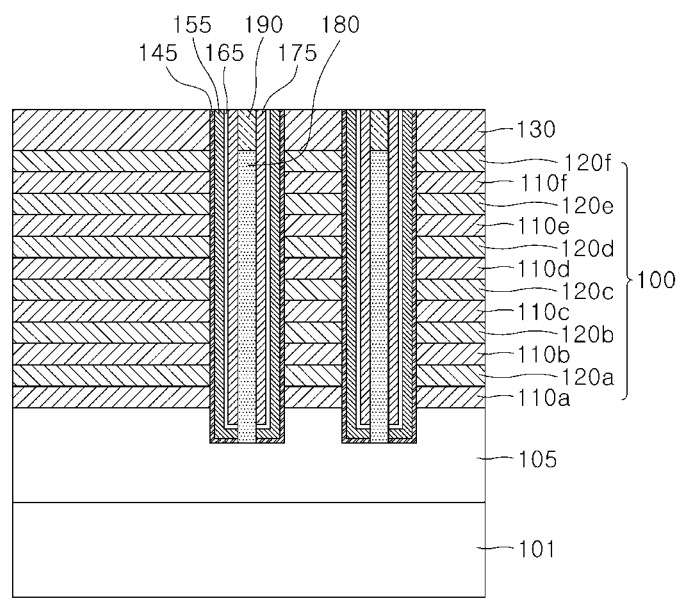

Referring to FIG. 9, an insulation layer may be formed to fill an inner space of each of the first trenches 1. The insulation layer filling the first trenches 1 may be formed using a CVD process or a coating process. The insulation layer may be formed to include a silicon oxide material, a silicon nitride material or a silicon oxynitride material.

After the insulation layer filling the first trenches 1 is formed, a planarization process may be performed to selectively remove the insulation layer on a top surface of the first upper insulation layer 130. As a result of the planarization process, insulation patterns 180 are formed in first trenches 1 that correspond to the filling material patterns (180 of FIGS. 2A and 2B). The top surfaces of the insulation patterns 180 may be substantially coplanar with the top surface of the first upper insulation layer 130. The planarization process may be performed using a chemical mechanical polishing (CMP) technique or an etch-back technique.

Subsequently, the insulation patterns 180 may be etched back to form recesses in the first trenches 1. A conductive layer may then be formed to fill the recesses in the first trenches 1, and the conductive layer may be formed on the first upper insulation layer 130. The conductive layer may be planarized such that channel contact patterns 190 are formed in the recesses and portions of the conductive layer on the first upper insulation layer 130 are removed. In an embodiment, the conductive layer may be formed using a CVD process or a coating process. Top surfaces of the channel contact patterns 190 may be substantially coplanar with the top surface of the first upper insulation layer 130.

The channel contact patterns 190 may include a metal material or a metal nitride material. The channel contact patterns 190 may be formed to reduce a contact resistance value between the channel layer 175 and a bit line connection pattern (250 illustrated in FIG. 15) formed in a subsequent process.

Figure 10:
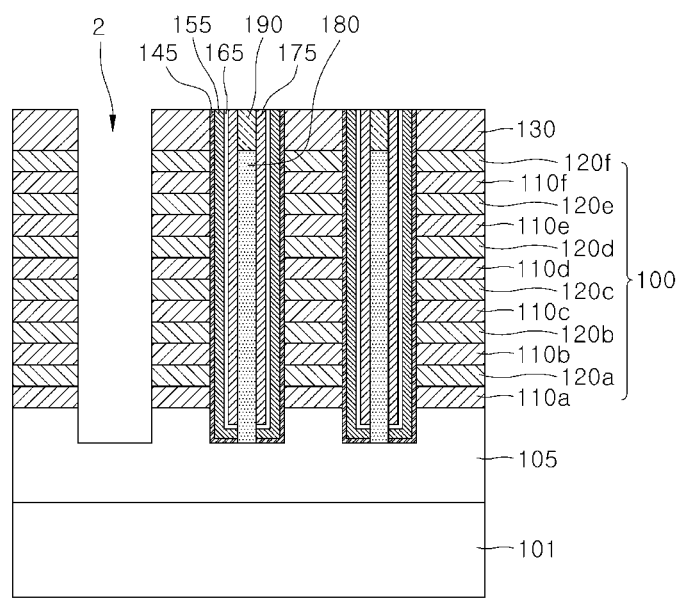

Referring to FIG. 10, the stack layer structure 100 may be patterned to form a second trench 2 exposing a portion of the base conductive layer 105. The interlayer insulation layers 110a, 110b, 110c, 110d, 110e and 110f and the interlayer sacrificial layers 120a, 120b, 120c, 120d, 120e and 120f may be exposed at a sidewall of the second trench 2.

Referring to FIG. 11, the interlayer sacrificial layers 120a, 120b, 120c, 120d, 120e and 120f exposed by the second trench 2 may be selectively removed. In an embodiment, the interlayer sacrificial layers 120a, 120b, 120c, 120d, 120e and 120f may be selectively removed by supplying a wet etchant into the second trench 2. An etch rate of the interlayer sacrificial layers 120a, 120b, 120c, 120d, 120e and 120f may be higher than an etch rate of the interlayer insulation layers 110a, 110b, 110c, 110d, 110e and 110f, and the first upper insulation layer 130. In an embodiment, while the interlayer sacrificial layers 120a, 120b, 120c, 120d, 120e and 120f are etched, the interlayer insulation layers 110a, 110b, 110c, 110d, 110e and 110f are not etched from the stack layer structure 100. As a result, first recesses 3 exposing sidewall portions of each of the capping oxide layers 145 may be formed.

Referring to FIG. 12, the sidewall portions of the capping oxide layers 145 exposed by the first recesses 3 may be selectively removed. The sidewall portions of the capping oxide layers 145 exposed by the first recesses 3 may be selectively removed using a wet etch technique. As a result, second recesses 4 exposing sidewall portions of each of the ferroelectric insulation layers 155 may be formed. Accordingly, capping oxide patterns 145a may remain between each of the ferroelectric insulation layers 155 and the interlayer insulation layers 110a, 110b, 110c, 110d, 110e and 110f.

In some embodiments, the first recesses 3 and the second recesses 4 may be formed by a single etch process. That is, the interlayer sacrificial layers 120a, 120b, 120c, 120d, 120e and 120f and portions of each of the capping oxide layers 145 may be simultaneously removed using the same etchant.

Figure 13:
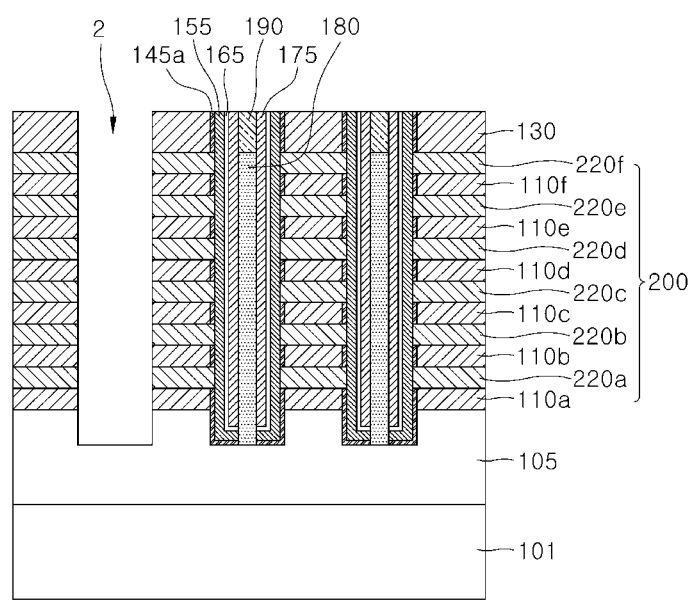

Referring to FIG. 13, a conductive layer may be formed to fill the second trench 2 and the second recesses 4, and the conductive layer may be patterned to form gate electrode layers 220a, 220b, 220c, 220d, 220e and 220f remaining in the second recesses 4. In an embodiment, patterning the conductive layer may be performed by anisotropic etch process. During the patterning of the conductive layer, portions of the conductive layer in the second trench 2 may be removed. The gate electrode layers 220a, 220b, 220c, 220d, 220e and 220f may be formed to contact the sidewalls of the ferroelectric insulation layers 155. The conductive layer for providing the gate electrode layers 220a, 220b, 220c, 220d, 220e and 220f may be formed to include a metal material, a conductive metal nitride material, a conductive metal carbide material, a conductive metal silicide material or a combination containing at least two of the above different materials. For example, the conductive layer for providing the gate electrode layers 220a, 220b, 220c, 220d, 220e and 220f may be formed to include a tungsten (W) material, a titanium (Ti) material, a copper (Cu) material, a tungsten nitride (WN) material, a titanium nitride (TiN) material, a tantalum nitride (TaN) material, a tungsten carbide (WC) material, a titanium carbide (TiC) material, a tungsten silicide (WSi) material, a titanium silicide (TiSi) material, a tantalum silicide (TaSi) material or a combination material containing at least two of the above different materials. The interlayer insulation layers 110a, 110b, 110c, 110d, 110e and 110f and the gate electrode layers 220a, 220b, 220c, 220d, 220e and 220f may constitute a stack structure 200.

Figure 14:
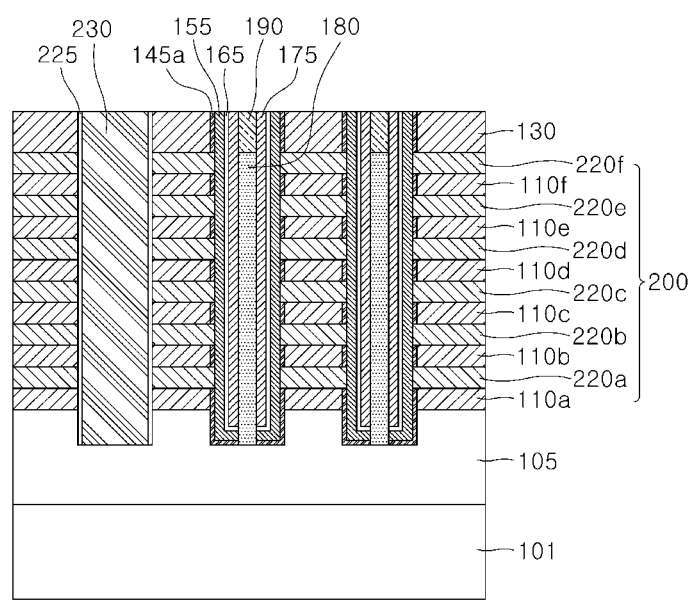

Referring to FIG. 14, a spacer insulation layer 225 may be formed on a sidewall of the second trench 2. The spacer insulation layer 225 may be formed by forming an insulation layer on an inner surface of the second trench 2 and on the top surface of the first upper insulation layer 130 and by anisotropically etching the insulation layer to selectively remove at least a portion of the insulation layer disposed on a bottom surface of the second trench 2 and disposed on the top surface of the first upper insulation layer 130. The insulation layer for providing the spacer insulation layer 225 may be formed using a CVD technique or an ALD technique.

Referring again to FIG. 14, a conductive layer may be formed in the second trench 2 and on the top surface of the first upper insulation layer 130. The conductive layer is planarized such that a first source line connection pattern 230 fills the second trench 2, but portions of the conductive layer on the first upper insulation layer 130 are removed. The first source line connection pattern 230 is surrounded by the spacer insulation layer 225. The first source line connection pattern 230 may be formed to include a metal material, a conductive metal nitride material, a conductive metal carbide material, a conductive metal silicide material or a combination containing at least two of the above different materials. For example, the first source line connection pattern 230 may be formed to include a tungsten (W) material, a titanium (Ti) material, a copper (Cu) material, a tungsten nitride (WN) material, a titanium nitride (TiN) material, a tantalum nitride (TaN) material, a tungsten carbide (WC) material, a titanium carbide (TiC) material, a tungsten silicide (WSi) material, a titanium silicide (TiSi) material, a tantalum silicide (TaSi) material or a combination material containing at least two of the above different materials.

The spacer insulation layer 225 may electrically insulate the first source line connection pattern 230 from the gate electrode layers 220a, 220b, 220c, 220d, 220e and 220f.

Figure 15:
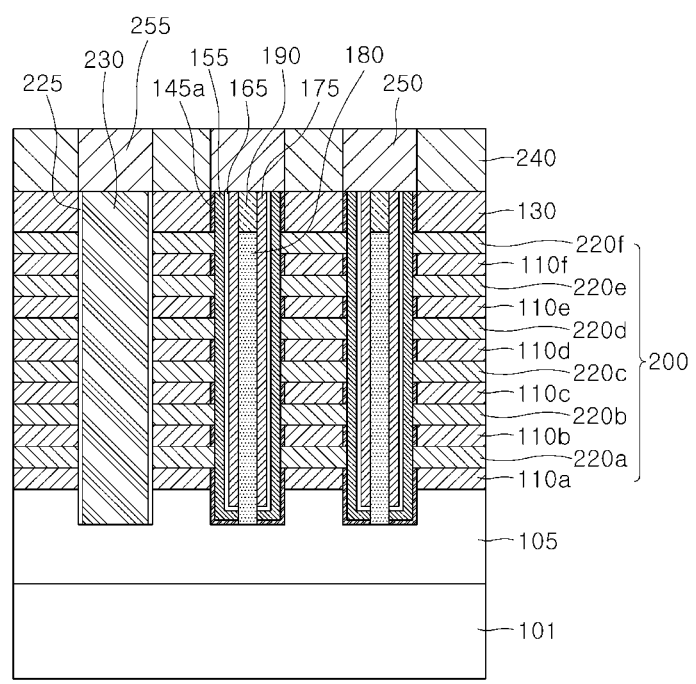

Referring to FIG. 15, a second upper insulation layer 240 may be formed on the first upper insulation layer 130. The second upper insulation layer 240 may be formed to include a silicon oxide material, a silicon nitride material or a silicon oxynitride material. The second upper insulation layer 240 may be formed using a CVD technique or a coating technique.

Subsequently, bit line connection patterns 250 electrically connected to the channel contact patterns 190 may be formed in the second upper insulation layer 240. In addition, a second source line connection pattern 255 electrically connected to the first source line connection pattern 230 may be formed in the second upper insulation layer 240.

In an embodiment, method of forming the bit line connection patterns 250 and the second source line connection pattern 255 may be as follows. Initially, the second upper insulation layer 240 may be etched to form contact holes that expose the channel contact patterns 190 and the first source line connection pattern 230. Next, a conductive layer may be formed in the contact holes to provide the bit line connection patterns 250 and the second source line connection pattern 255. The conductive layer for providing the bit line connection patterns 250 and the second source line connection pattern 255 may be formed to include a tungsten (W) material, a titanium (Ti) material, a copper (Cu) material, a tungsten nitride (WN) material, a titanium nitride (TiN) material, a tantalum nitride (TaN) material, a tungsten carbide (WC) material, a titanium carbide (TiC) material, a tungsten silicide (WSi) material, a titanium silicide (TiSi) material, a tantalum silicide (TaSi) material or a combination material containing at least two of the above different materials.

The first and second source line connection patterns 230 and 255 may electrically connect the base conductive layer 105 to a source line (not shown) of the semiconductor device. Each of the bit line connection patterns 250 may electrically connect one of the channel layers 175 to one of bit lines (not shown) of the semiconductor device.

A semiconductor device according to an embodiment may be fabricated by the processes described above. The embodiment described above may provide a method of fabricating a three-dimensional semiconductor memory device that employs a ferroelectric insulation layer and a gate electrode layer as a gate dielectric layer and a gate electrode. According to the embodiment, a capping oxide layer may be disposed to cover a ferroelectric material. Thus, the capping oxide layer may effectively influence the ferroelectric material while an annealing process is performed to crystallize the ferroelectric material. Thus, a ferroelectric insulation layer obtained by annealing the ferroelectric material may exhibit an improved ferroelectric property. As a result, high performance semiconductor devices and methods of fabricating the high performance semiconductor devices may be provided.

According to the embodiments described above, the operational reliability of a three-dimensional semiconductor device including a ferroelectric insulation layer disposed in a trench may be improved. Specifically, according to an embodiment, a capping oxide material, a ferroelectric material and a semiconductor material may be sequentially formed on a sidewall of the trench, and the ferroelectric material may be annealed to provide a ferroelectric insulation layer having a crystalline structure. In such a case, the capping oxide material may be in contact with a surface of the ferroelectric material while the ferroelectric material is annealed. Thus, the ferroelectric insulation layer obtained by annealing the ferroelectric material may exhibit an improved ferroelectric property. Consequently, the reliability of the three-dimensional semiconductor device operating with variation of remnant polarization in the ferroelectric insulation layer can be improved.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A semiconductor device comprising:
    a stack structure including a plurality of interlayer insulation layers and a plurality of gate electrode layers alternately stacked on a substrate;
    a ferroelectric insulation layer and a channel layer sequentially stacked on a sidewall of a trench that penetrates the stack structure; and
    a capping oxide pattern disposed between the ferroelectric insulation layer and each of the plurality of interlayer insulation layers,
    wherein the capping oxide pattern and the ferroelectric insulation layer include the same metal oxide material.

2. The semiconductor device of claim 1, further comprising a source line connection pattern and a bit line connection pattern electrically connected to the channel layer, respectively.

3. The semiconductor device of claim 1, further comprising a plurality of word lines electrically connected to the plurality of gate electrode layers, respectively,
    wherein polarization states in portions of the ferroelectric insulation layer adjacent to the gate electrode layers are independently determined according to voltages applied to the word lines.

4. The semiconductor device of claim 1, wherein the capping oxide pattern has a lattice constant which is different from a lattice constant of the ferroelectric insulation layer.

5. The semiconductor device of claim 1, wherein an oxygen vacancy concentration of the capping oxide pattern is higher than an oxygen vacancy concentration of the ferroelectric insulation layer.

6. The semiconductor device of claim 1, wherein the metal oxide material includes at least one of a hafnium oxide material, a zirconium oxide material and a hafnium zirconium oxide material.

7. The semiconductor device of claim 1,
wherein the capping oxide pattern includes at least one dopant
selected from the group consisting of silicon (Si), aluminum (Al), yttrium (Y), lanthanum (La) and zirconium (Zr).

8. The semiconductor device of claim 1,
wherein the ferroelectric insulation layer includes at least one dopant
selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr) and gadolinium (Gd).

* * * * *